(12) United States Patent
Loibl et al.

(10) Patent No.: US 6,570,773 B1
(45) Date of Patent: May 27, 2003

(54) CONTROL APPARATUS FOR AN AUTOMOBILE

(75) Inventors: Josef Loibl, Bad Abbach (DE); Ulf Scheuerer, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/914,140

(22) PCT Filed: Feb. 1, 2000

(86) PCT No.: PCT/DE00/00208
§ 371 (c)(1),
(2), (4) Date: Aug. 23, 2001

(87) PCT Pub. No.: WO00/50263
PCT Pub. Date: Aug. 31, 2000

(30) Foreign Application Priority Data

Feb. 24, 1999 (DE) .......................................... 199 07 949

(51) Int. Cl.⁷ ................................................ H05K 5/00
(52) U.S. Cl. ...................... 361/752; 361/748; 361/749
(58) Field of Search ............................... 361/749, 752, 361/753, 757, 720, 760, 792, 816, 818, 800, 801; 174/35 R, 51; 257/666

(56) References Cited

U.S. PATENT DOCUMENTS

| | | | | |
|---|---|---|---|---|
| 4,736,266 A | * | 4/1988 | Tanibe | 361/792 |
| 4,751,482 A | * | 6/1988 | Fukuta et al. | 174/52.3 |
| 5,831,836 A | * | 11/1998 | Long et al. | 174/254 |
| 5,832,598 A | * | 11/1998 | Greenman et al. | 29/832 |
| 6,104,618 A | * | 8/2000 | Loibl | 361/749 |

FOREIGN PATENT DOCUMENTS

| | | |
|---|---|---|
| DE | 42 28 818 | 3/1994 |
| DE | 42 37 083 A1 | 5/1994 |
| DE | 43 40 280 | 3/1995 |
| DE | 44 37 664 | 4/1996 |
| DE | 195 42 883 A1 | 8/1996 |
| DE | 195 11 487 | 10/1996 |
| DE | 195 15 622 | 11/1996 |
| DE | 197 12 842 | 8/1998 |
| DE | 197 34 032 | 12/1998 |

* cited by examiner

*Primary Examiner*—David Martin
*Assistant Examiner*—Thanh S. Phan
(74) *Attorney, Agent, or Firm*—Staas & Halsey LLP

(57) ABSTRACT

An integrated motor vehicle control unit has a metallic base plate and a housing lid which is coupled thereto in an oil-tight fashion. A flexible printed circuit board makes contact with an electronic circuit of the control unit, extends on the base plate and is led out of the control unit between the housing lid and the base plate. A printed circuit board carrier structure continues the base plate in a planar fashion and permits the position of the flexible printed circuit board outside the control unit to be selectively influenced.

8 Claims, 3 Drawing Sheets

CONTROL APPARATUS FOR AN AUTOMOBILE

BACKGROUND OF THE INVENTION

1. Field of the Invention

The invention relates to a control unit for a motor vehicle

2. Description of the Related Art

Recently there has been an increasing tendency to integrate the engine control units and the transmission control units into the motor vehicle assembly (i.e. engine or transmission) to be controlled. This concept has a considerable potential to save costs in comparison to the conventional use of external control units. Technological difficulties arise owing to increased system requirements such as being leak proof with respect to ambient media (oil, gasoline, water), operational capability over a wide temperature range (for example −40° C. to 150° C.) and resistance to abrasions (up to approximately 40 g).

A control unit described in German patent DE 197 12 842 C1 has an electrical connection between the control electronics and the electrical components to be controlled realized by a flexible printed circuit board. It has been found that it may occasionally be difficult to ensure a defined course of the flexible printed circuit board outside the control unit.

In German patent application DE 195 15 622 A1, a transmission control unit is described in which the electrical contact with the electrical components actuated by the control unit are formed by a punched grid which is injection molded in the plastic lid part of the control unit. This solution permits contact to be made with the electrical components in a mechanically stable and electrically secure way, but it is relatively complex in structural terms. Another motor vehicle control unit is described in German patent DE 197 34 032 C1.

German laid-open application DE 42 28 818 A1 describes a control unit for motor vehicles in which a flexible printed circuit board is led between a base plate and an inner sealing frame in a seal-forming fashion to a housing plug. The electrical connection of the motor vehicle control unit to external electrical components is made via the housing plug.

In German laid-open application DE 44 37 664 A1, a motor vehicle control unit is described which has a housing body formed of a curable foam. A plurality of flexible printed circuit boards project out of the housing body and form connections to electrical components located in the vicinity.

SUMMARY OF THE INVENTION

The invention is based on the object of providing a control unit for a motor vehicle which permits external electrical components (plugs, actuators, sensors) to be electrically connected to the control electronics of the control unit in a way which can be implemented cost-effectively and is mechanically secure.

The object on which the invention is based is achieved by having the printed circuit board carrier structure continue the base plate in a planar fashion, so that a course of the flexible printed circuit board outside the control unit is sufficiently positionally defined in accordance with the structural circumstances . As a result, mechanical damage to the flexible printed circuit board, such as may occur, for example, owing to vibrations due to friction of the printed circuit board against adjacent walls or engine/transmission components, can be reliably avoided.

The use of a flexible printed circuit board for distributing current makes possible significant cost advantages in comparison to solutions which are structurally more complex (cabling with plug-type connectors, punched grids integrated into housing parts etc.).

The printed circuit board carrier structure is preferably dimensioned in such a way that its outer contour surrounds the outer contour of the flexible printed circuit board essentially on all sides. The flexible printed circuit board is then covered over its entire surface by the printed circuit board carrier structure and its position can be controlled via the latter at virtually any point.

The printed circuit board carrier structure can preferably include disconnectable sections and/or sections which extend in various planes. This permits the specific advantages of a flexible printed circuit board in terms of the compensation of mounting and component tolerances to continue to be used.

In principle, the flexible printed circuit board can be held in the desired, defined position solely by bearing against the printed circuit board carrier structure. However, in a particularly advantageous variant of the invention the flexible printed circuit board is secured locally to the printed circuit board carrier structure at specifically predefined positions. This permits the flexible printed circuit board to be positioned and aligned precisely on the printed circuit board carrier structure, which facilitates the mounting of the composite structure, composed of the printed circuit board carrier structure and printed circuit board, in the transmission/engine. By selecting suitable securing positions it is possible to ensure that the printed circuit board cannot be damaged owing to different degrees of expansion of materials even when there are very large fluctuations in temperature.

The preferably metallic base plate may be anchored in a depression or opening in the printed circuit board carrier structure which is preferably composed of plastic.

BRIEF DESCRIPTION OF THE DRAWINGS

The invention is described below by way of example with reference to the drawing, in which.

DETAILED DESCRIPTION OF THE PREFERRED EMBODIMENTS

Figure 1:
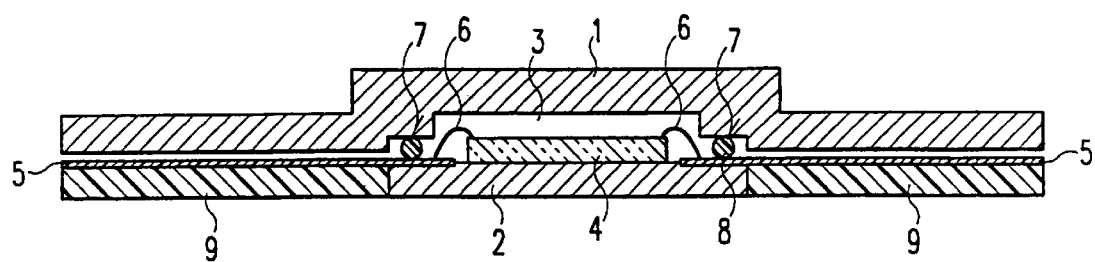
FIG. 1 is a schematic cross sectional view of a control unit according to the invention along the line I—I in FIG. . 2.

As illustrated in FIG. 1, the printed circuit board carrier structure 9 can be realized in the form of a plastic panel. The metallic base plate 2 can either be injection molded directly into the printed circuit board carrier structure 9 (plastic panel) or can be subsequently anchored in a central opening or depression in the printed circuit board carrier structure 9 by a snap action connection or the like.

Figure 2:
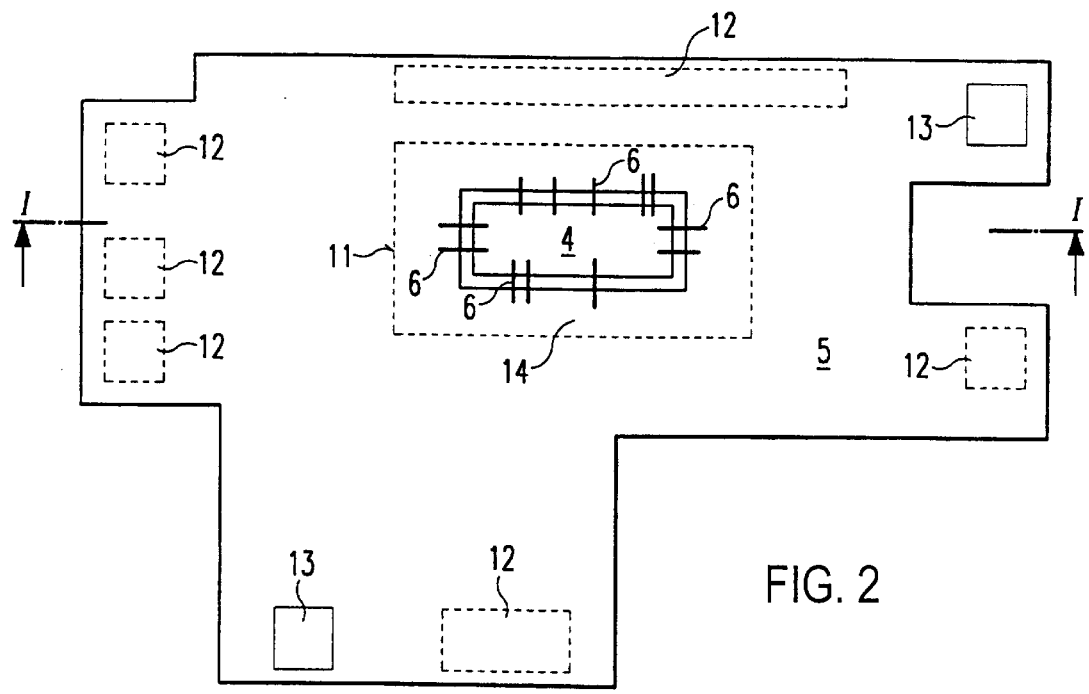
FIG. 2 is a schematic view of the control unit in FIG. 1 in a plan view without the lid.

FIG. 2 shows the control unit with the housing lid 1 removed (without ring seal 8) in a plan view. Preferably, the flexible printed circuit board 5 has a central punched-out portion 10 through which the circuit carrier 4 projects. A contour line 11 indicates the circumferential profile of the metallic base plate 2.

To provide a leak proof seal the flexible printed circuit board 5 is attached to the base plate 2 by bonding (laminating) over its entire surface (i.e. over the entire region 14 between the contour line 11 and the punched-out portion 10). In contrast, the flexible printed circuit board 5 is attached to the printed circuit board carrier structure 9 (i.e. in the region outside the contour line 11) only partially, namely at predefined adherence zones 12, by suitable measures such as bonding (laminating), for example. Securing only partially ensures that temperature fluctuations do not lead to damage to the flexible printed circuit board 5 despite different expansion characteristics of the base plate 2 and of the printed circuit board carrier structure 9.

The adherence zones 12 are preferably located in regions which are provided for a later formation of electrical press-on contacts for electrical components. Other regions 13 of the flexible printed circuit board 5 cannot be secured to the printed circuit board carrier structure 9 due to a tolerance compensation which is required there. These may be regions 13 at which a transmission plug is to be provided or to which a sensor/actuator which can be attached in different mounting positions or is configured as a moving part is to be connected.

Figure 3:
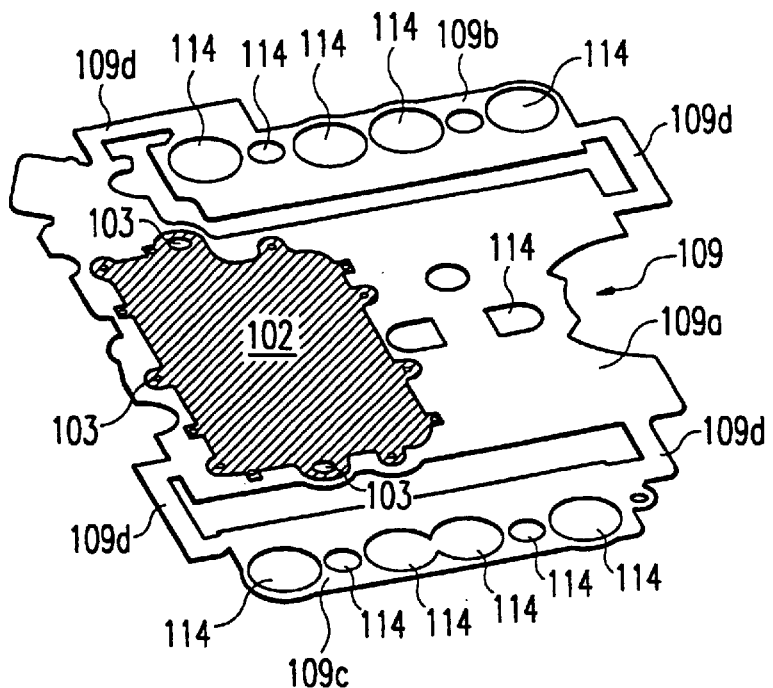
FIG. 3 is a perspective view of a printed circuit board carrier structure with integrated base plate.

FIG. 3 shows a printed circuit board carrier structure 109 with integrated base plate 102 in a perspective view. The metallic base plate 102 has, in its edge region, mounting holes 103 by which the base plate 102 can be secured to the housing lid 1 by screw connections or other suitable attachment elements.

The printed circuit board carrier structure 109 has a central section 109a and two side segments 109b and 109c. The side segments 109b, 109c are connected to the central section 109a via webs 109d. If, for structural reasons, it is necessary for the flexible printed circuit board 105 (see FIG. 4) to extend in different planes, the side segments 109b, 109c can be varied in height or tilted with respect to the central section 109a by virtue of the flexibility of the webs 109d. The webs 109d can also be constructed with step shapes so that the central section 109a and the side segments 109b, 109c are already structurally located in different planes. A third possibility is to provide transversely extending predetermined break lines in the webs 109d. The webs 109d can then be severed at these predetermined break lines when the controller is installed in the transmission/engine, with the result that the side segments 109b, 109c are then only connected to the central section 109a by the flexible printed circuit board 105.

Openings 114 for the electrical components with which contact is to be made can be provided in the side segments 109b, 109c and in the central section 109a.

Figure 4:
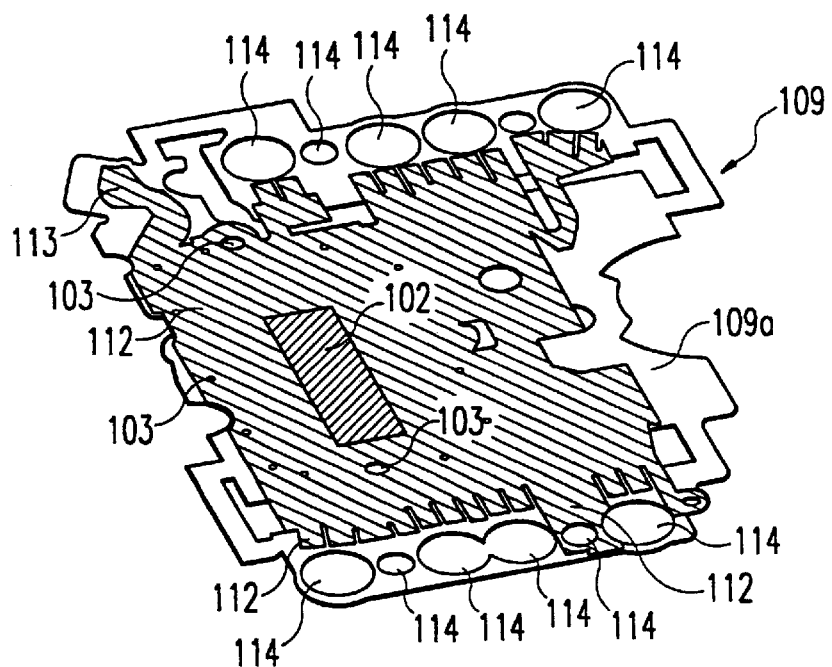
FIG. 4 is a perspective view of the printed circuit board carrier structure illustrated in FIG. 3 overlaid with a flexible printed circuit board.

FIG. 4 shows the composite structure (illustrated in FIG. 3) composed of the base plate 102 and printed circuit board carrier structure 109 with flexible printed circuit board 105 lying on it. Adherence zones 112 (according to 12) are located above the base plate 102 and in edge regions of the openings 114. The printed circuit board 105 is not secured to the printed circuit board carrier structure 109 in a region 113 at which a plug part is to be provided.

Figure 5:
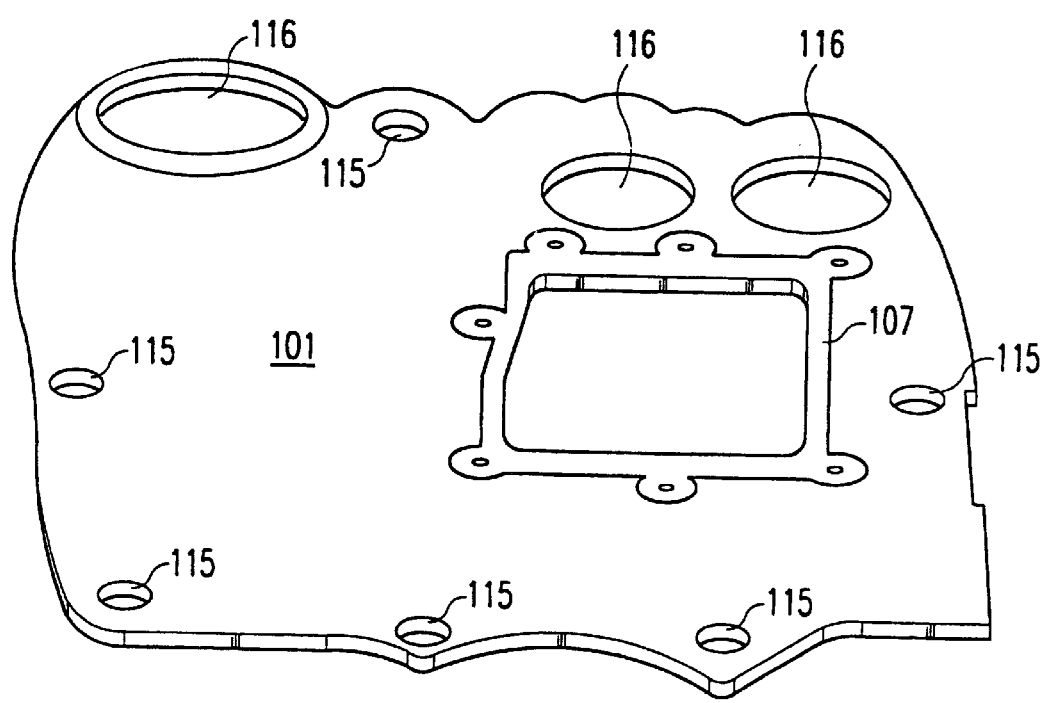
FIG. 5 is a perspective view of a housing lid.

FIG. 5 shows by way of example a housing lid 101 of a control unit according to the invention. The housing lid 101 can be attached in the interior of a transmission/engine casing via bores 115, and it forms the carrier of the control unit. The sealing face 107 surrounds the hood-shaped recess in the housing lid 101 which bounds the cavity 3.

Mounting holes 116 are provided in housing lid 101 by which electrical components with which electric contact is to be made are attached to the housing lid 101. In the assembled state, openings 114 are aligned with the mounting holes 116. The flexible printed circuit board 5, 105 can be completely covered on both sides by the housing lid 1, 101 and the printed circuit board carrier structure 9, 109.

What is claimed is:

1. A control unit for a motor vehicle having electrical components, comprising:

a printed circuit carrier structure having at least one substantially planar surface;

a base plate, disposed in the printed circuit carrier structure, having at least one substantially planar surface continuing the at least one substantially planar surface of the printed circuit carrier structure and an outer contour substantially surrounded by the printed circuit carrier structure;

a housing lid coupled to the base plate in an oil-tight fashion;

an electronic circuit accommodated in a cavity formed by the housing lid and the base plate; and a flexible printed circuit board electrically connecting the electronic circuit to the electrical components outside the cavity by extending on the substantially planar surfaces of the base plate and the printed circuit carrier structure, from the base plate inside the cavity, between the housing lid and the base plate, to the electrical components, the flexible printed circuit board being selectively positioned by the printed circuit carrier structure between the outer contour of the base plate and the electrical components.

2. The control unit as claimed in claim 1, wherein the printed circuit board carrier structure has an outer contour dimensioned to substantially surround an outer contour of the flexible printed circuit board.

3. The control unit as claimed in claim 1, wherein the printed circuit board carrier structure includes at least two disconnectable sections.

4. The control unit as claimed in claim 1, wherein the printed circuit board carrier structure includes at least two sections extending in planes different from the substantially planar surface of the printed circuit board carrier structure.

5. The control unit as claimed in claim 1, wherein the printed circuit board carrier structure is provided with at least one recess for holding an electrical component.

6. The control unit as claimed in claim 1, wherein the flexible printed circuit board is secured to the printed circuit board carrier structure at predefined positions.

7. The control unit as claimed in claim 6, wherein the base plate is composed of metal and is anchored in one of a depression and an opening in the printed circuit board carrier structure.

8. The control unit as claimed in claim 7, wherein the printed circuit board carrier structure is composed of plastic, and wherein the base plate is injection molded directly into the printed circuit board carrier structure.

* * * * *